(12) United States Patent
Tsuchida et al.

(10) Patent No.: US 11,908,610 B2
(45) Date of Patent: Feb. 20, 2024

(54) INDUCTOR, INDUCTOR WITH CIRCUIT BOARD, AND ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Toshiyuki Tsuchida, Yokkaichi (JP); Shigeki Yamane, Yokkaichi (JP); Junya Aichi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 749 days.

(21) Appl. No.: 16/969,770

(22) PCT Filed: Jan. 25, 2019

(86) PCT No.: PCT/JP2019/002400
§ 371 (c)(1),
(2) Date: Aug. 13, 2020

(87) PCT Pub. No.: WO2019/159648
PCT Pub. Date: Aug. 22, 2019

(65) Prior Publication Data
US 2020/0411231 A1    Dec. 31, 2020

(30) Foreign Application Priority Data
Feb. 13, 2018  (JP) .................. 2018-022823

(51) Int. Cl.
*H01F 27/29* (2006.01)
*H01F 27/24* (2006.01)
*H01F 27/36* (2006.01)

(52) U.S. Cl.
CPC .......... *H01F 27/292* (2013.01); *H01F 27/24* (2013.01); *H01F 27/363* (2020.08)

(58) Field of Classification Search
CPC ....... H01F 27/292; H01F 27/363; H01F 27/24
See application file for complete search history.

(56) References Cited

U.S. PATENT DOCUMENTS 4,882,550 A * 11/1989 Baba ................. H03B 5/18
331/49
5,159,537 A * 10/1992 Okano ............... H05K 9/0033
174/387

(Continued)

FOREIGN PATENT DOCUMENTS

JP  H3-034316    2/1992
JP  H5-006821 U  1/1993

(Continued)

OTHER PUBLICATIONS

First Office Action, German Patent Application No. 112019000768.8, dated Sep. 9, 2022.

(Continued)

*Primary Examiner* — Marlon T Fletcher
*Assistant Examiner* — Malcolm Barnes
(74) *Attorney, Agent, or Firm* — Honigman LLP

(57) ABSTRACT

An inductor includes: a magnetic core; a conduction path penetrating the magnetic core; a pedestal portion including a core holding portion that holds the magnetic core, and support portions that support, when placed on a circuit board, electronic components at a height at which the electronic components can be accommodated on the circuit (Continued)

board side with respect to the core holding portion; and a shield portion that is provided on the circuit board side with respect to the magnetic core, and that shields a magnetic field generated by flow of electricity in the conduction path.

12 Claims, 11 Drawing Sheets

(56) References Cited

U.S. PATENT DOCUMENTS

| | | | | |
|---|---|---|---|---|
| 6,590,783 | B2 * | 7/2003 | Spratte | H05K 9/0032 |
| | | | | 174/DIG. 35 |
| 7,361,030 | B2 * | 4/2008 | Inoue | H05K 1/141 |
| | | | | 439/76.1 |
| 8,976,540 | B2 * | 3/2015 | Yoo | H04B 1/3833 |
| | | | | 361/752 |
| 2002/0017976 | A1 * | 2/2002 | Okamoto | H01F 27/027 |
| | | | | 336/229 |
| 2015/0287511 | A1 * | 10/2015 | Furukawa | H01F 27/02 |
| | | | | 336/84 R |
| 2020/0321836 | A1 * | 10/2020 | Kagawa | F04B 35/04 |

FOREIGN PATENT DOCUMENTS

| | | | |
|---|---|---|---|
| JP | H056821 | U * | 1/1993 |
| JP | H1041165 | A * | 2/1998 |
| JP | 2004-103757 | A | 4/2004 |
| JP | 2004-152947 | A | 5/2004 |
| JP | 2012-104595 | A | 5/2012 |
| JP | 2018-019512 | A | 2/2018 |
| WO | 2017-170817 | A1 | 10/2017 |

OTHER PUBLICATIONS

International Search Report, Application No. PCT/JP2019/002400, dated Apr. 9, 2019. ISA/Japan Patent Office.

* cited by examiner

INDUCTOR, INDUCTOR WITH CIRCUIT BOARD, AND ELECTRICAL JUNCTION BOX

CROSS-REFERENCE TO RELATED APPLICATIONS

This application is the U.S. national stage of PCT/JP2019/002400 filed on Jan. 25, 2019, which claims priority of Japanese Patent Application No. JP 2018-022823 filed on Feb. 13, 2018, the contents of which are incorporated herein.

TECHNICAL FIELD

The present specification discloses a technique concerning an inductor, an inductor with circuit board, and an electrical junction box.

BACKGROUND

A technique for mounting an inductor component on a circuit board has been known. In JP 2004-152947A, a recessed portion is formed in a first electronic component that is an inductor component mounted on a mounting board. A second electronic component is mounted on the mounting board in the recessed portion of the first electronic component. With this configuration, the mounting area is reduced by the mounting area of the second electronic component, and the size of the mounting board is reduced.

In the above configuration, although it is possible to reduce the size by disposing the second electronic component in the recessed portion of the inductor component, there is a concern that the magnetic field generated from the inductor component may affect the second electronic component.

The technique described in the present specification has been completed on the basis of the above circumstances, and an object thereof is to provide an inductor, an inductor with circuit board, and an electrical junction box capable of reducing the influence on electronic components mounted on the circuit board due to a magnetic field generated by flow of electricity in a conduction path in the inductor, while enabling downsizing.

SUMMARY

An inductor described in the present specification includes: a magnetic core; a conduction path penetrating the magnetic core; a pedestal portion including a core holding portion that holds the magnetic core, and a support portion that supports, when placed on a circuit board, an electronic component at a height at which the electronic component can be accommodated on the circuit board side with respect to the core holding portion; and a shield portion that is provided on the circuit board side with respect to the magnetic core, and that shields a magnetic field generated by flow of electricity in the conduction path.

According to this configuration, when the support portion of the inductor is placed on the circuit board, electronic components can be accommodated between the core holding portion and the circuit board. Accordingly, a space capable of accommodating the electronic components on the circuit board is increased, the mounting density of the electronic components can be increased, and the size can be reduced. Here, in the case where the inductor is placed on the circuit board in this manner, the distance between the conduction path of the inductor and the electronic components on the circuit board is short, and thus there is a concern about the influence of the magnetic field from the conduction path to the electronic components. According to this configuration, because the magnetic field generated on the electronic components side by flow of electricity in the conduction path is shielded by the shield portion, it is possible to reduce the influence of the magnetic field generated by flow of electricity in the conduction path on the electronic components. Therefore, it is possible to reduce the influence of the magnetic field generated by flow of electricity in the conduction path in the inductor on the electronic components mounted on the circuit board, while reducing the size.

As embodiments of the technique described in the present specification, the following aspects are preferable.

The inductor may further include a conductive cover portion that covers the side of the magnetic core opposite to the circuit board side.

With this configuration, the conductive cover portion can reduce the influence of the magnetic field generated on the side opposite to the circuit board side with respect to the magnetic core on the outside.

The shield portion may be provided over the entire surface of the pedestal portion on the circuit board side.

With this configuration, it is possible to reduce the influence of the entire conduction path in the inductor on the electronic components mounted on the circuit board.

The inductor may further include a terminal portion that is connected to the conduction path, and that is connectable to an external terminal, wherein the pedestal portion may include a terminal holding portion that holds the terminal portion.

With this configuration, the inductor can reduce the influence of the magnetic field generated by flow of electricity in the terminal portion on the circuit board side, while having the function of a terminal block.

An inductor with circuit board includes: the inductor; a circuit board on which the pedestal portion is placed and that has a ground pattern connected to a ground potential; and the electronic component that is mounted on the circuit board, and that has a terminal connected to the ground pattern.

The influence of the magnetic field from the inductor may affect the electronic components connected to the ground pattern of the circuit board. However, according to the present configuration, it is possible to reduce the influence on the electronic components in the configuration in which the influence of the magnetic field is likely to occur due to the connection to the ground pattern.

An electrical junction box including: the inductor; the circuit board; the electronic component; and a case that accommodates the inductor, the circuit board, and the electronic component.

Advantageous Effects of Disclosure

According to the technique described in the present specification, it is possible to reduce the influence of the magnetic field generated by flow of electricity in the conduction path on the electronic components mounted on the circuit board, while reducing the size.

DETAILED DESCRIPTION OF PREFERRED EMBODIMENTS

A first embodiment will be described with reference to FIGS. 1 to 11.

Figure 3:
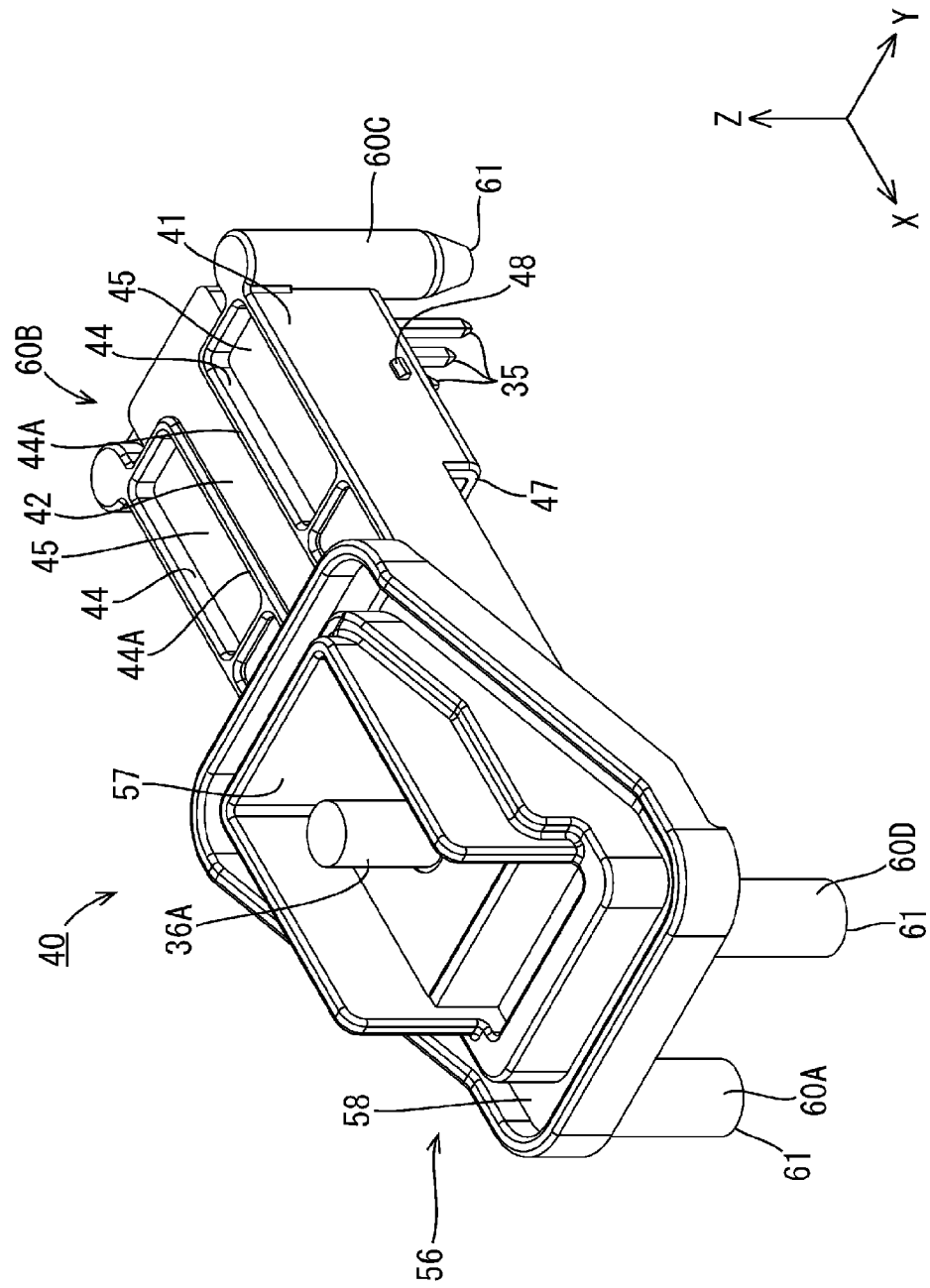
FIG. 3 is a perspective view showing a pedestal portion on which a conduction path is formed.

An electrical junction box 10 according to the first embodiment in which an inductor 30 is accommodated is disposed in a power supply path between a power source such as a battery, and a load including an on-board electrical component such as a lamp or a drive motor of a vehicle such as an electric vehicle or a hybrid vehicle, and can be used for, for example, a DC-DC converter or an inverter. In the following description, the X direction, the Y direction, and the Z direction in FIG. 3 are referred to as a front direction, a right direction, and an upper direction, respectively.

Figure 1:
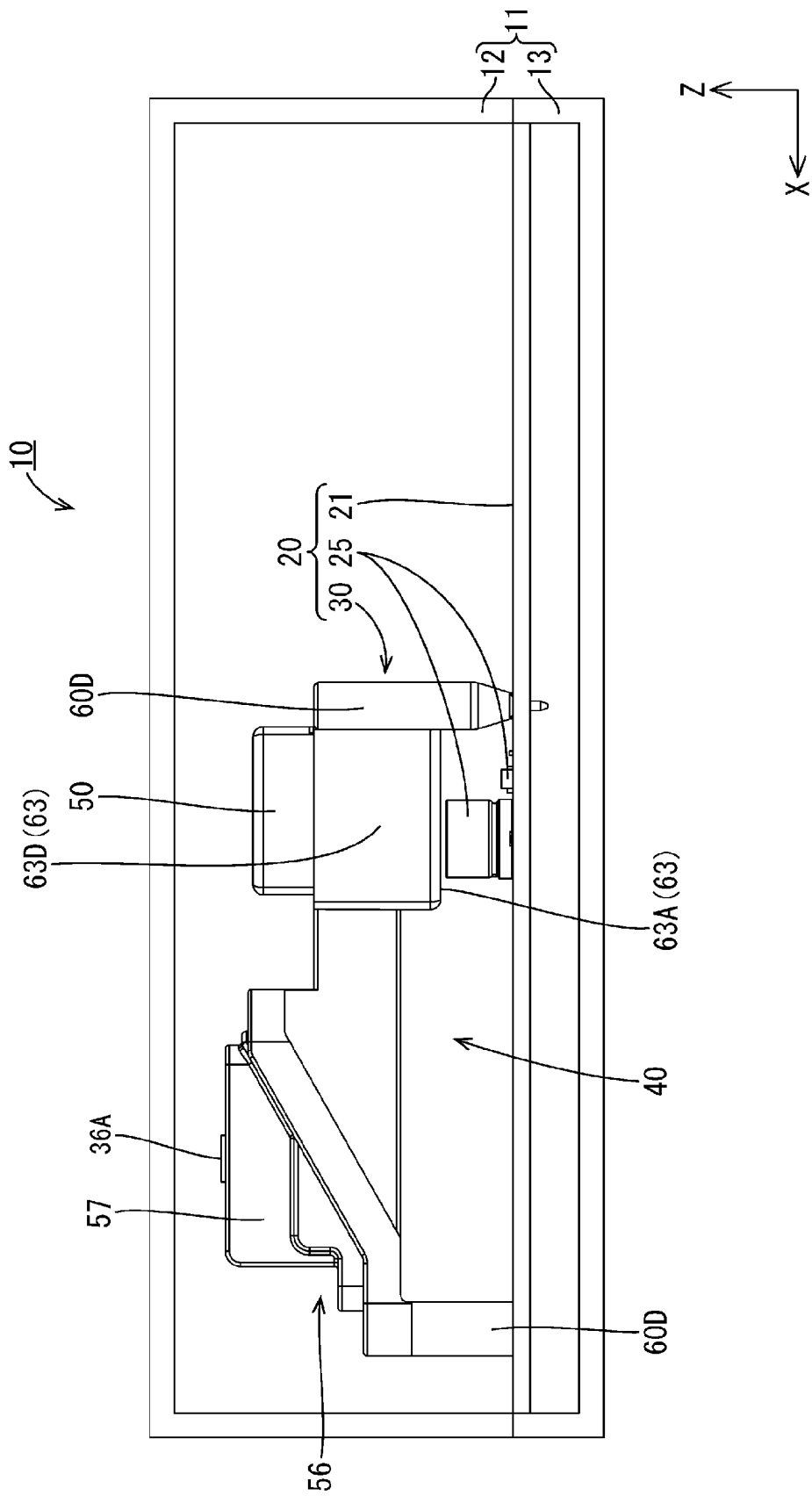
FIG. 1 is a cross-sectional view showing an electrical junction box according to a first embodiment.

As shown in FIG. 1, the electrical junction box 10 includes an inductor assembly, and a case 11 that accommodates the inductor assembly 20. The case 11 is made of synthetic resin or metal, and has a lower case 13 and an upper case 12 fitted into the lower case 13.

Figure 2:
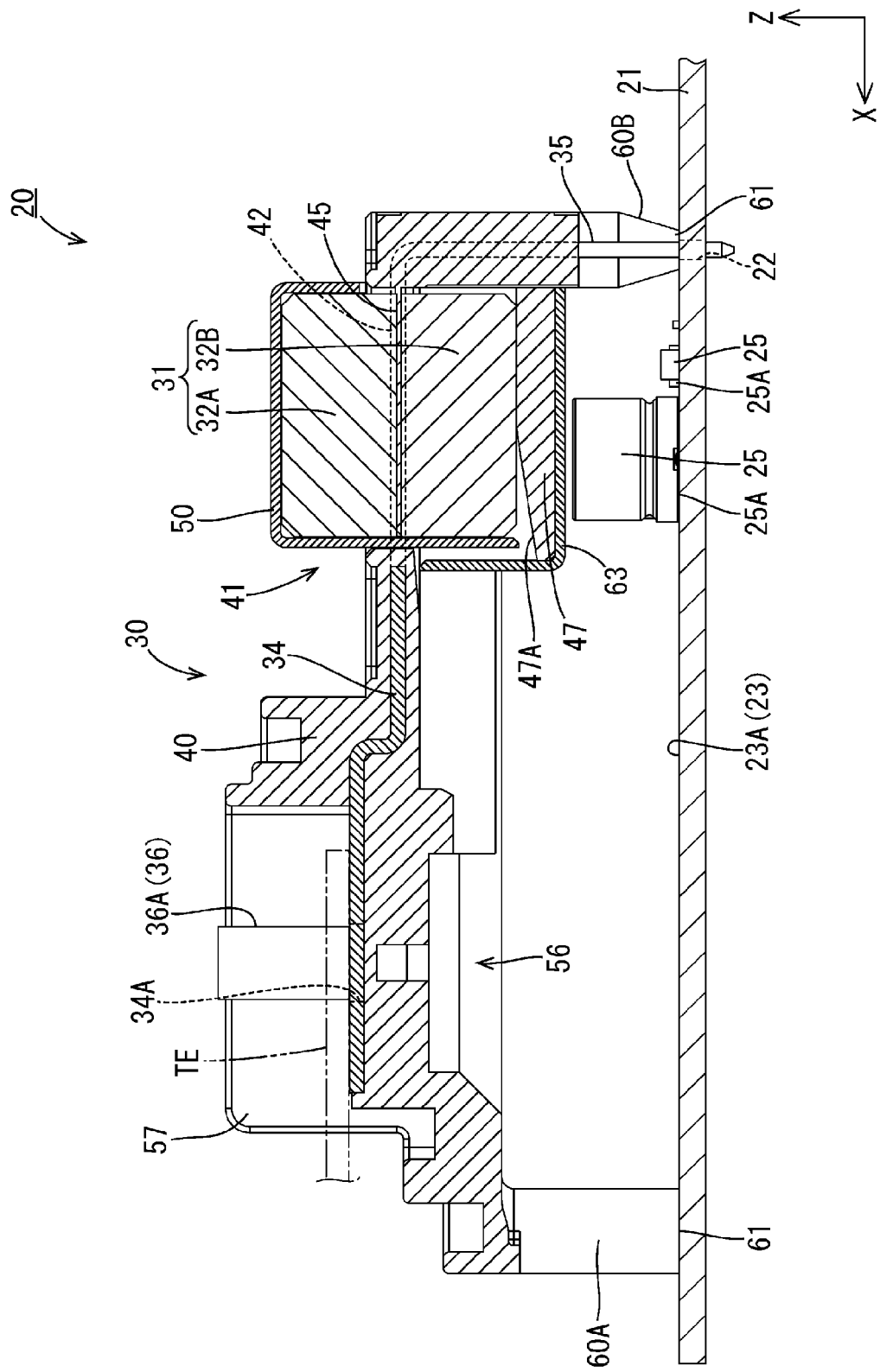
FIG. 2 is a vertical cross-sectional view of a position passing through a recessed portion of a pedestal portion in the inductor with circuit board.

As shown in FIG. 2, the inductor assembly 20 includes a circuit board 21, a plurality of electronic components 25 mounted on the circuit board 21, and an inductor 30 mounted on the circuit board 21. The circuit board 21 is a printed circuit board in which a pattern 23 made of copper foil or the like is formed on an insulating plate made of an insulating material by a printed wiring technique. The pattern 23 includes a ground pattern 23A connected to a ground potential. In the present embodiment, the circuit board 21 is a printed circuit board only, but is not limited to this. A circuit board in which a metal plate material (a bus bar) such as copper or a copper alloy is stacked on a printed circuit board may also be used. A plurality of through holes 22 continuous with the pattern 23 are formed in the circuit board 21.

The electronic components 25 each have a plurality of lead terminals connected to the pattern 23 of the circuit board 21. The plurality of lead terminals 25A are soldered to the pattern 23 of the circuit board 21, and one lead terminal 25A of the electronic component 25 is connected to the ground pattern 23A. At least one electronic component 25 mounted on the circuit board 21 is disposed in the space below the inductor 30. Examples of the electronic component 25 include various electronic components such as a capacitor, a FET (Field Effect Transistor), a resistor, and a coil.

The inductor 30 includes a magnetic core 31, a conduction path 34 penetrating the magnetic core 31, a pedestal portion 40 made of insulating synthetic resin for holding the magnetic core 31 and the conduction path 34, and a shield portion 63 for shielding a magnetic field generated by flow of electricity in the conduction path 34.

The magnetic core 31 is made of a magnetic material such as a ferrite, and is constituted by opposing a pair of divided members 32A and 32B having the same shape. A flat plate-shaped insertion portion 42 of the pedestal portion 40 is inserted between the pair of divided members 32A and 32B. The magnetic core 31 may also be fixed by winding a tape from the outside of the pair of divided members 32A and 32B, in a state where the pair of divided members 32A and 32B sandwich the insertion portion 42.

The conduction path 34 is made of a flat metal plate material (a bus bar) of copper, a copper alloy, or the like, and one end thereof is bent in an L shape to form a plurality of circuit board connection terminals 35 connected to the conduction path 34 of the circuit board 21, and the other end thereof is bent in a step shape and an open hole 34A into which the shaft portion of a stud bolt 36 is inserted is formed in a part raised by one step. The shaft portion of the stud bolt 36 is a terminal portion 36A that is connectable to a mating terminal TE to be connected to a terminal portion of an external electric wire. The terminal portion 36A is an output terminal that outputs electric power to the outside, and unlike the terminal portion 36A, another terminal portion (not shown) to which electric power is input from the outside is mounted on the circuit board 21. The head portion of the stud bolt 36 is welded to the hole edge portion of the open hole 34A in the conduction path 34.

As shown in FIG. 3, the plurality of circuit board connection terminals are rod-shaped and disposed in a line at predetermined intervals, and are electrically connected to the pattern 23 of the circuit board 21 by being inserted into the through holes 22 of the circuit board 21 and soldered.

The pedestal portion 40 is made of insulating synthetic resin, is in intimate contact with the entire surface of the conduction path 34 other than the upper surface of the terminal portion 36A, and includes a core holding portion 41 that holds the magnetic core 31, a terminal holding portion 56 that holds the terminal portion 36A, and support portions 60A to 60D that support the core holding portion 41 and the terminal holding portion 56. The core holding portion 41 includes the insertion portion 42, which is inserted between the pair of divided members 32A and 32B, recessed portions 44 into which ends of the divided members 32A and 32B are fitted, and a receiving portion 47 that is disposed on the lower side of the insertion portion 42 and that receives the lower divided member 32B.

The insertion portion 42 extends in a flat plate shape in the front-rear direction, and is configured such that resin is in intimate contact with the entire circumference of the conduction path 34. The insertion portion 42 is provided with a pair of left and right thin spacer portions 45 that do not overlap the conduction path 34. The spacer portions 45 are sandwiched between the divided members 32A and 32B to hold the intervals between the divided members 32A and 32B.

The recessed portions 44 are provided on both upper and lower surfaces of the core holding portion 41, and are recessed in a rectangular shape elongated in the front-rear direction. An annular rib 44A protrudes from the edge portion of each recessed portion 44. The spacer portions 45 are provided between the upper and lower recessed portions 44. The receiving portion 47 has a U-shaped plate shape into which the divided member 32B can be fitted, connects the lower sides of the left and right side walls of the core holding portion 41, and as shown in FIG. 2, an inclined surface 47A is formed by cutting out the inner surface of the distal end side in an inclined shape.

Figure 4:
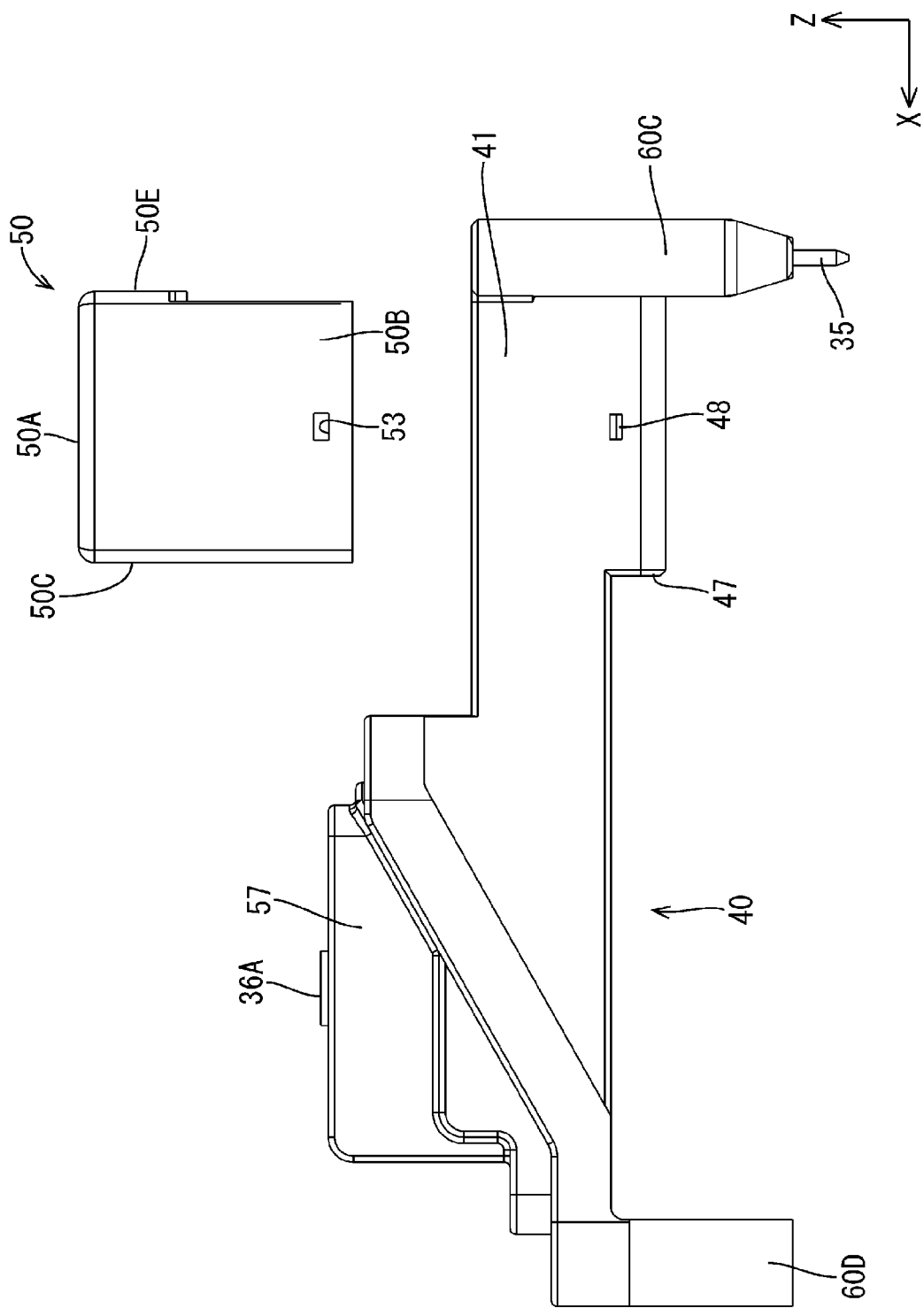
FIG. 4 is a side view illustrating how a cover portion is mounted on the pedestal portion on which the conduction path is formed.
Figure 6:
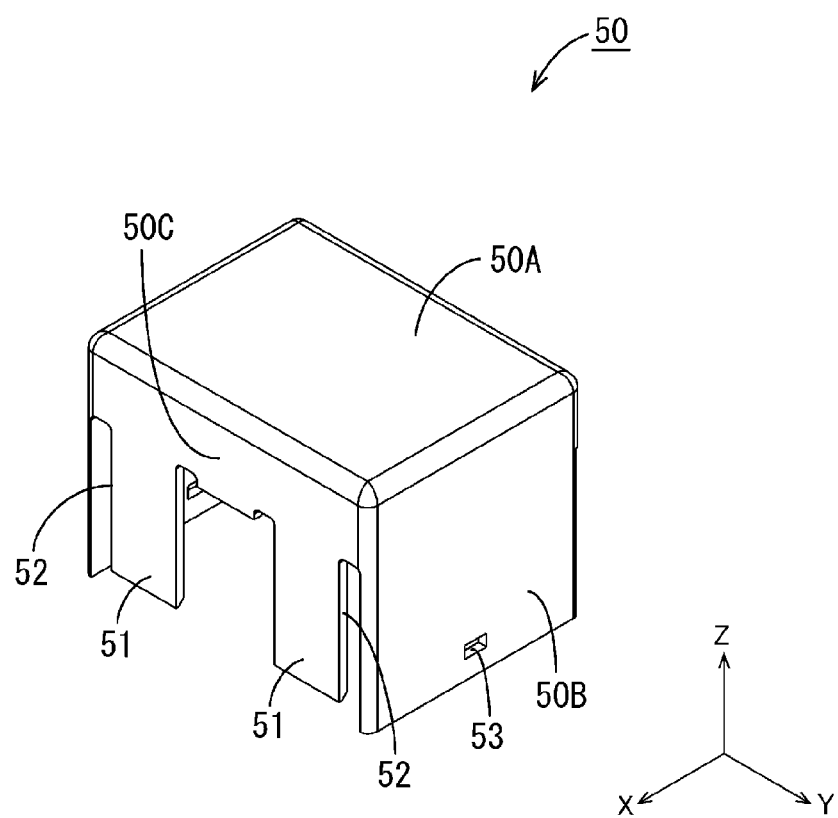
FIG. 6 is a perspective view showing the cover portion.
Figure 7:
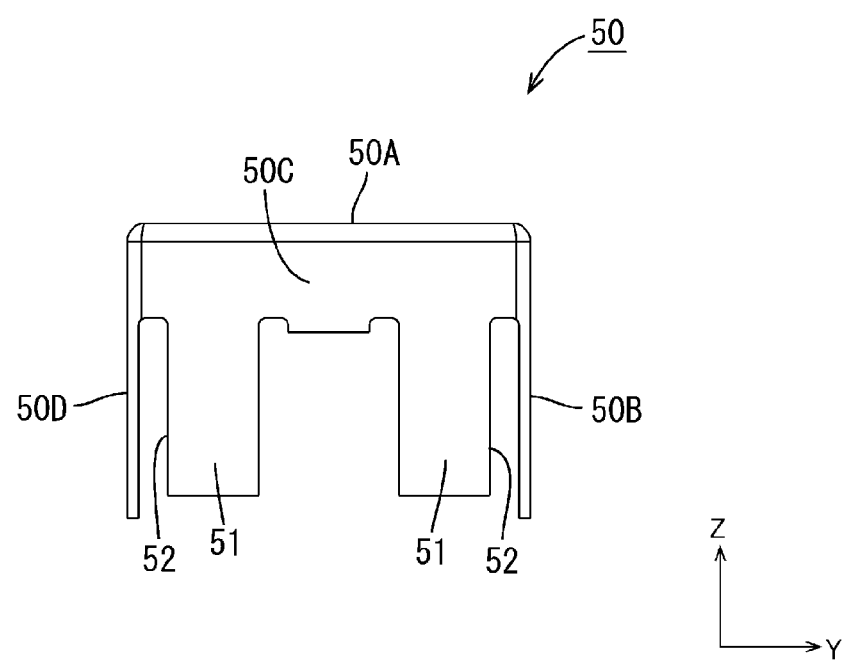
FIG. 7 is a front view showing the cover portion.
Figure 8:
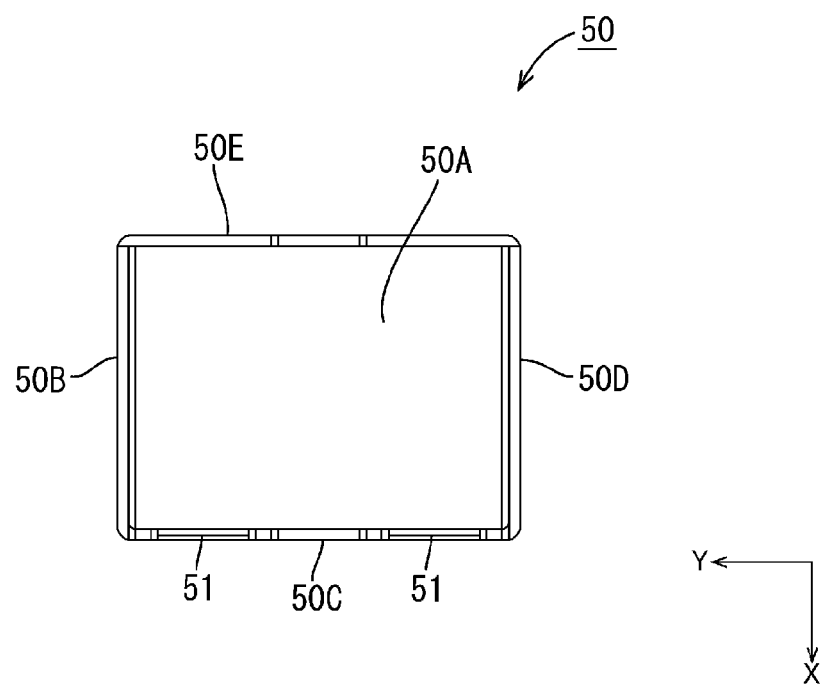
FIG. 8 is a bottom view showing the cover portion.

As shown in FIG. 2, the upper part of the core holding portion 41 is covered with a cover portion 50 in a state where the magnetic core 31 is attached to the insertion portion 42 of the core holding portion 41. As shown in FIGS. 6 to 8, the cover portion 50 includes a rectangular ceiling wall 50A, side walls 50B and 50D extending downward from the two side edges of the ceiling wall 50A, and a pair of connecting walls 50C and 50E connecting the side walls 50B and 50D, and extending downward from the front and rear edges of the ceiling wall 50A. A pair of insertion pieces 51 extend downward in a band shape in the connecting wall 50C. Insertion grooves 52 respectively extend vertically in a slit shape between the insertion pieces 51 and the side walls 50B and 50D. The lower side of the connecting wall 50E is cut out and shortened. As shown in FIG. 4, the pair of side walls 50B and 50D each have a locked portion 53 penetratingly formed in a rectangular shape, whose hole edge is locked to a locking portion 48 protruding on the outer side surface of the core holding portion 41 to position the cover portion 50. The locking portion 48 has a lower end protruding in a stepped shape, and the protruding dimension thereof is reduced in a slanting manner toward the upper side.

The terminal holding portion 56 is integrally formed with the core holding portion 41, and as shown in FIG. 3, includes an insulating wall 57 surrounding three sides of the terminal portion 36A, and a groove portion 58 disposed around the insulating wall 57.

Figure 5:
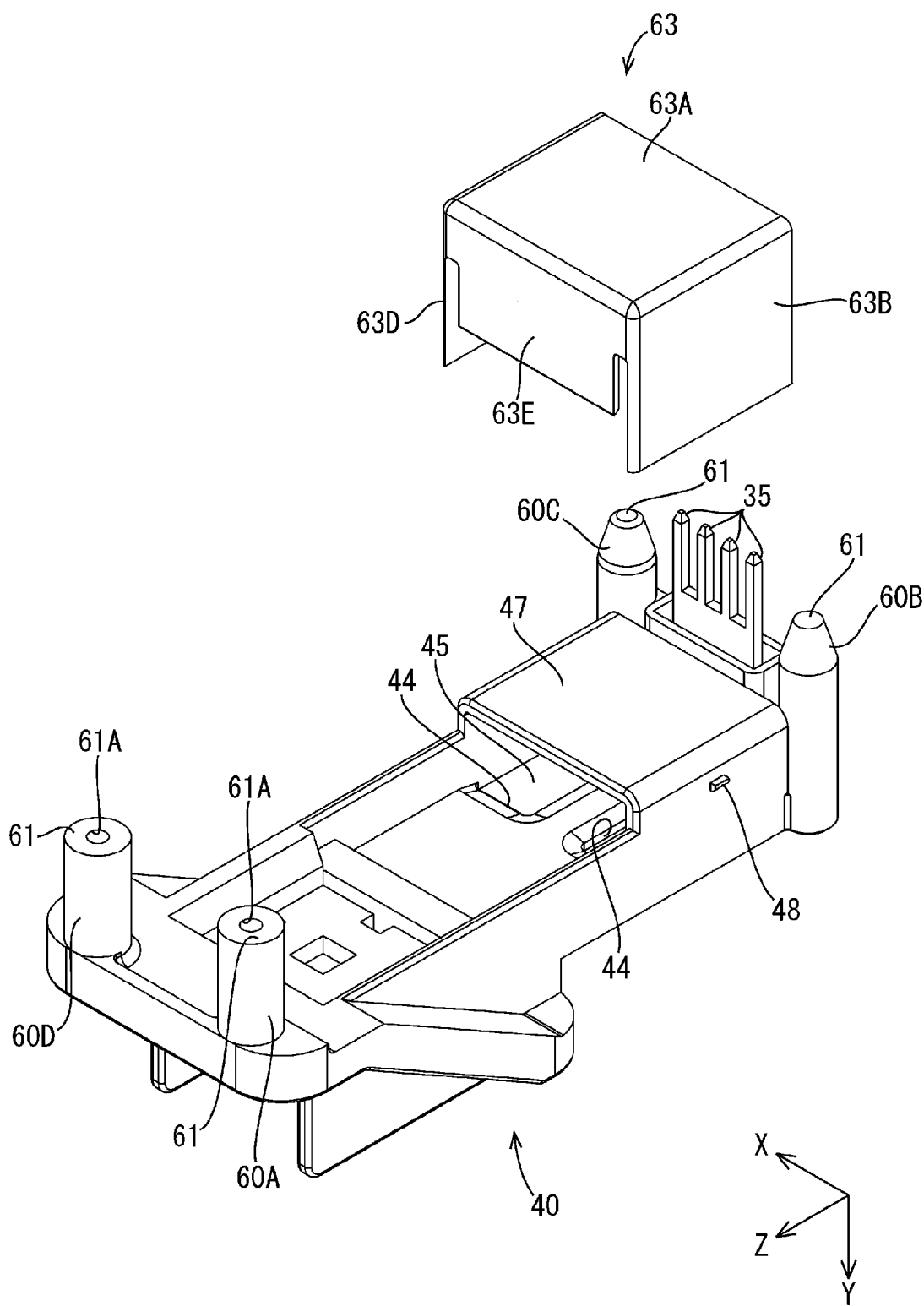
FIG. 5 is a perspective view illustrating how a shield portion is mounted on the pedestal portion on which the conduction path is formed.

The four support portions 60A to 60D are four cylindrical legs protruding downward at four corner positions of the pedestal portion 40 (the bottom surface side of the core holding portion 41 and the terminal holding portion 56), and the support portions 60A and 60D on the terminal holding portion 56 side have a height shorter than that of the two support portions 60B and 60C on the core holding portion 41 side, and an outer diameter larger than that of the two support portions 60B and 60C. The support portions 60A to 60D are formed, when support surfaces 61 of the support portions 60A to 60D are placed on the circuit board 21, to have a height that is capable of accommodating the electronic components 25 on the lower side (on the circuit board 21 side) of the core holding portion 41 and the terminal holding portion 56. In the two support portions 60B and 60C on the core holding portion 41 side, the circuit board connection terminals 35 are embedded, and lower ends of the two support portions 60B and 60C are tapered. As shown in FIG. 5, screw holes 61A are formed in the support surfaces 61 of the support portions 60A and 60D on the terminal holding portion 56 side. The circuit board 21 may also be fixed to the screw holes 61A of the support portions 60A and 60D by screws (not shown) from the lower side of the circuit board 21.

As shown in FIG. 2, the shield portion 63 is attached to the bottom surface of the receiving portion 47 of the pedestal portion 40, and has a box shape formed by punching a metal plate material such as aluminum, an aluminum alloy, copper, or a copper alloy with a press machine and bending the punched metal plate material. As shown in FIG. 5, the shield portion 63 includes a bottom plate portion 63A externally fitted to the lower surface side of the core holding portion 41 and covering the entire bottom surface of the receiving portion 47, a pair of side wall portions 63B and 63D covering the side walls 50B and 50D of the core holding portion 41, and a connecting wall portion 63E connecting the pair of side wall portions 63B and 63D and extending downward from the front edge of the bottom plate portion 63A.

The shield portion 63 can be fixed to the core holding portion 41 by, for example, an adhesive. Note, that the present disclosure is not limited to this, and various known fixing means can be used for fixing the shield portion 63. One of the shield portion 63 and the core holding portion 41 may also be provided with a locking claw (not shown), for example, and the other of the shield portion 63 and the core holding portion 41 may also be provided with a locked recessed portion to be locked to the locking claw to fix the shield portion 63 and the core holding portion 41.

Assembly of the electrical junction box 10 will be described next.

The electronic components 25 are placed on the circuit board 21 to which solder is applied, and the electronic components 25 are soldered to the circuit board 21 by, for example, reflow soldering. Further, the stud bolt 36 is welded to the conduction path 34 formed by a press machine, and the conduction path 34 and the pedestal portion 40 are integrally formed by insert molding in which the conduction path 34 is disposed in the mold (FIG. 3).

Figure 9:
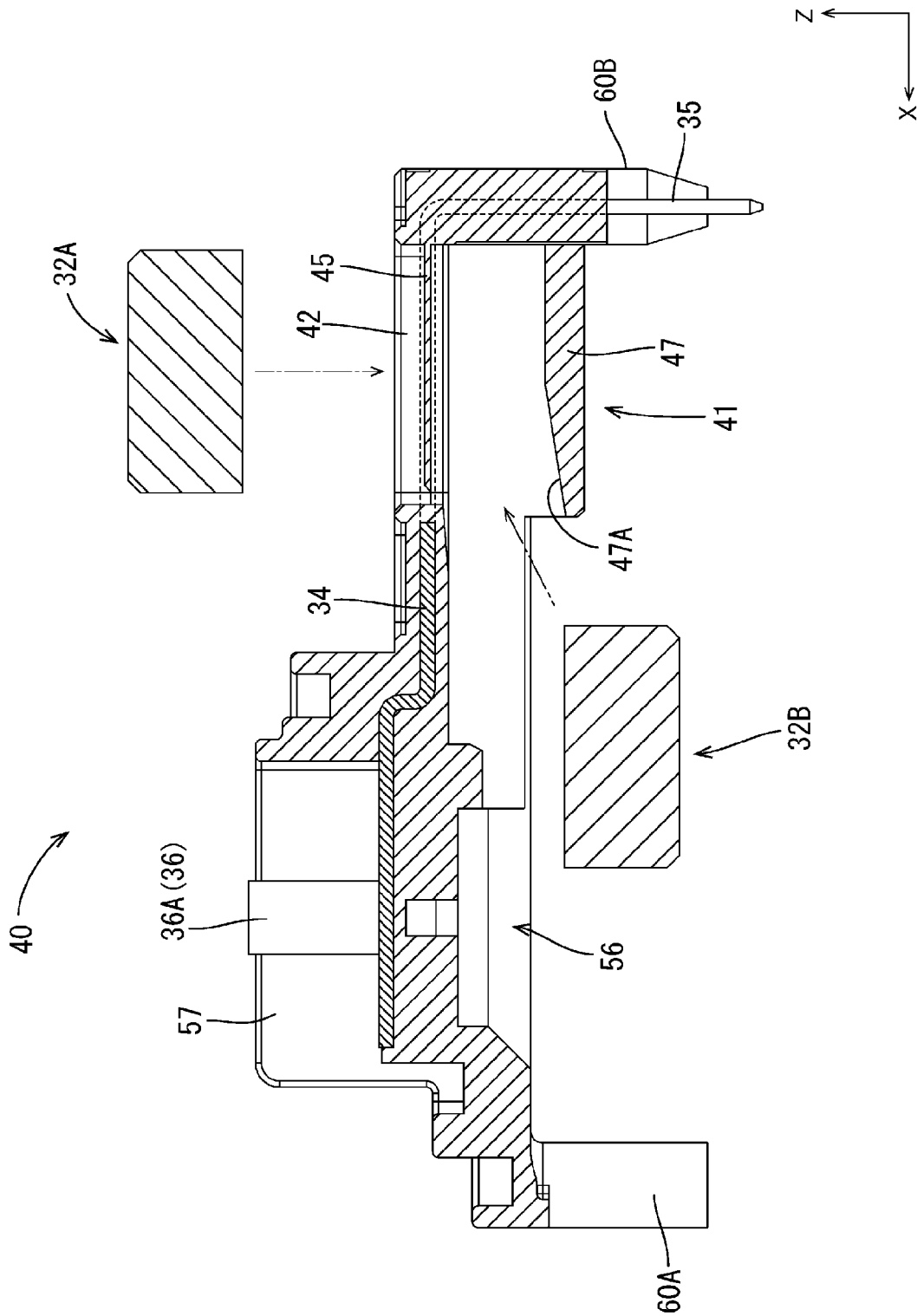
FIG. 9 is a cross-sectional view illustrating how divided members of a magnetic core are attached to the pedestal portion.
Figure 10:
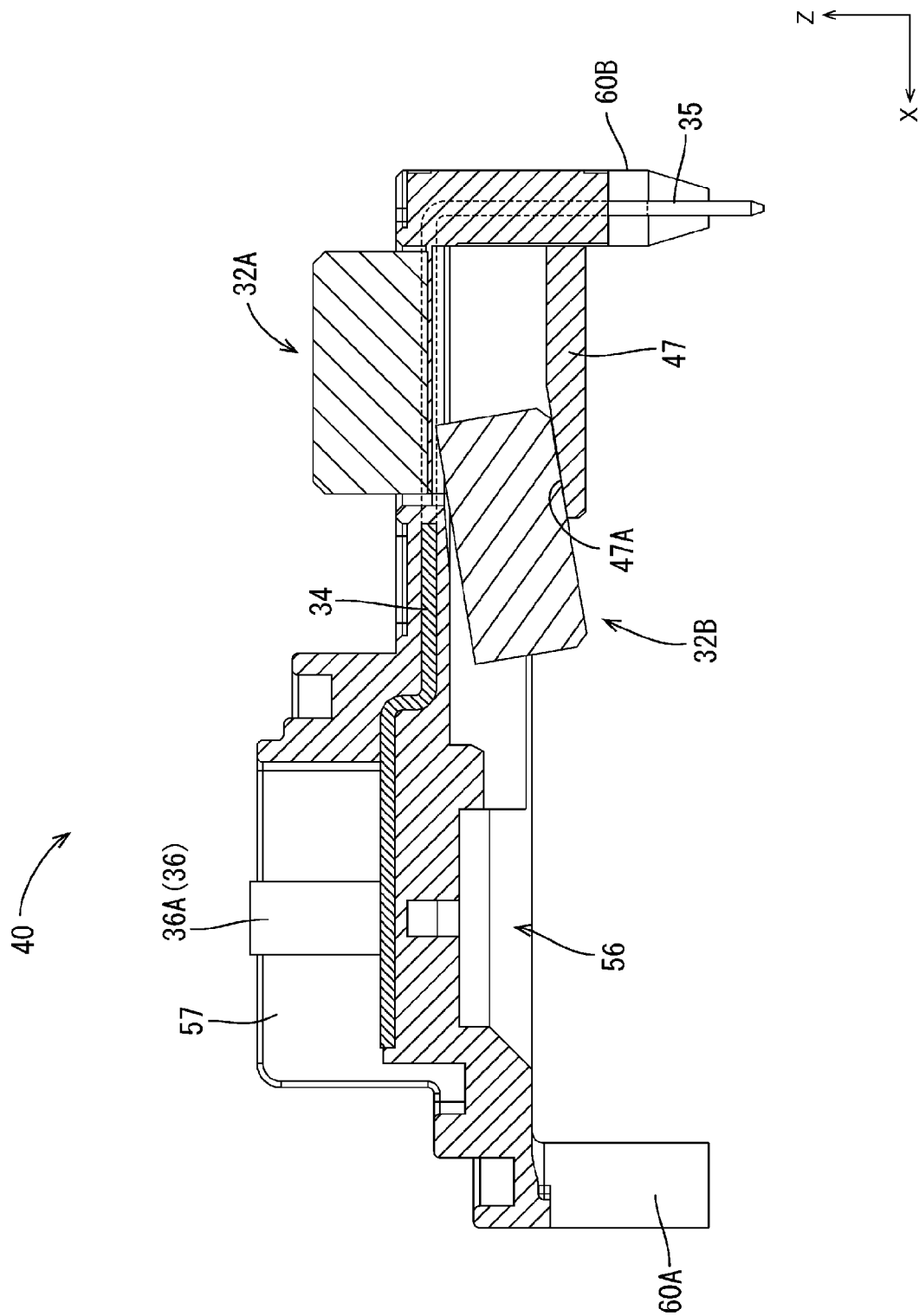
FIG. 10 is a cross-sectional view illustrating a step of mounting the divided members on the pedestal portion.
Figure 11:
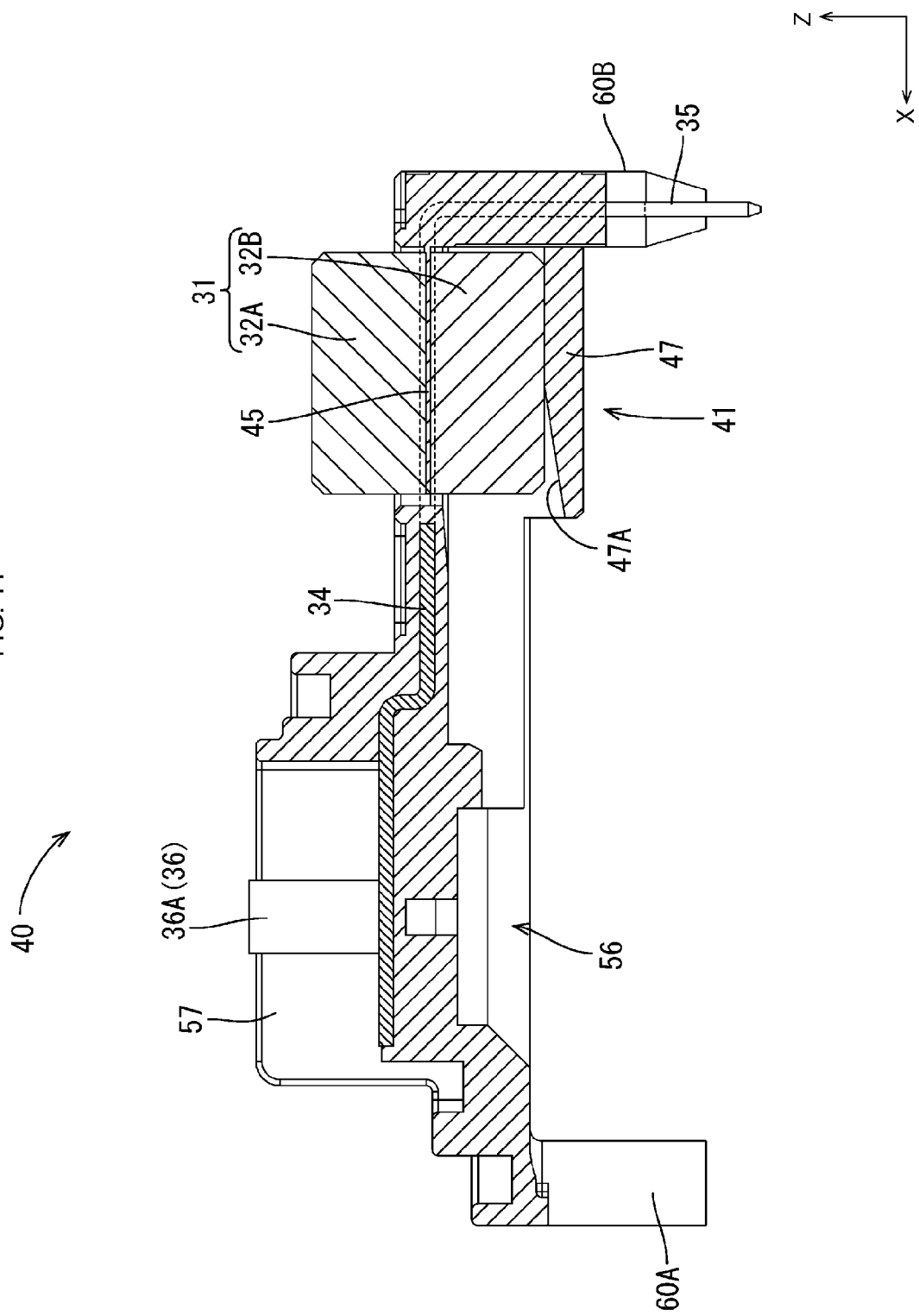
FIG. 11 is a cross-sectional view showing a state in which the magnetic core is attached to the pedestal portion.

Next, as shown in FIG. 9, the magnetic core 31 is formed by fitting one divided member 32A into the pair of upper recessed portions 44 from the upper side of the core holding portion 41, and fitting the divided member 32B into the pair of lower recessed portions 44 while sliding the divided member 32B on the inclined surface 47A of the receiving portion 47 from the lower side of the pedestal portion 40 (FIG. 10). Then, the magnetic core 31 is covered with the cover portion 50 (see FIG. 4), and the locked portions 53 of the cover portion 50 are locked to the locking portions 48 of the core holding portion 41.

Next, the shield portion 63 is fixed to the core holding portion 41 from the lower side of the pedestal portion 40 with an adhesive or the like (see FIG. 4), thereby forming the inductor 30. Next, the support portions 60A to 60D of the inductor 30 are placed on the circuit board 21 while the circuit board connection terminals 35 of the inductor 30 are inserted into the through holes 22 of the circuit board 21, and the circuit board connection terminals 35 are soldered to the through holes 22 of the circuit board 21 by, for example, flow soldering. In this manner, the inductor 20 with circuit board is formed (FIG. 2). The electrical junction box 10 is formed by covering the upper case 12 and the lower case 13 above and below the inductor 20 with circuit board (FIG. 1).

The operation and effect of the present embodiment will be described.

The inductor 30 includes: the magnetic core 31; the conduction path 34 penetrating the magnetic core 31; the pedestal portion 40 including the core holding portion 41 that holds the magnetic core 31, and the support portions 60A to 60D that support, when placed on a circuit board 21, electronic components 25 at a height at which the electronic components 25 can be accommodated on the circuit board 21 side with respect to the core holding portion 41; and the shield portion 63 that is provided on the circuit board 21 side with respect to the magnetic core 31, and that shields a magnetic field generated by flow of electricity in the conduction path 34.

According to the present embodiment, when the support portions 60A to 60D of the inductor 30 are placed on the circuit board 21, the electronic components 25 can be accommodated between the core holding portion 41 and the circuit board 21. Accordingly, a space capable of accommodating the electronic components 25 on the circuit board 21 is increased, the mounting density of the electronic components 25 can be increased, and the size can be reduced. Here, in the case where the inductor 30 is placed on the circuit board 21 in this manner, the distance between the conduction path 34 of the inductor 30 and the electronic components 25 on the circuit board 21 is short, and thus there is a concern about the influence of the magnetic field from the conduction path 34 to the electronic components 25 during flow of electricity. According to the present embodiment, because the magnetic field generated on the electronic components 25 side by flow of electricity in the conduction path 34 is shielded by the shield portion 63, it is possible to reduce the influence of the magnetic field generated by flow of electricity in the conduction path 34 on the electronic components 25. Therefore, it is possible to reduce the influence of the magnetic field generated by flow of electricity in the conduction path 34 in the inductor 30 on the electronic components 25 mounted on the circuit board 21, while reducing the size.

The inductor 30 further includes the conductive cover portion 50 that covers the side of the magnetic core 31 opposite to the circuit board 21 side.

With this configuration, the conductive cover portion 50 can reduce the influence of the magnetic field generated on the side opposite to the circuit board 21 side with respect to the magnetic core 31 on the outside.

The inductor 30 further includes the terminal portion 36A that is connected to the conduction path 34, and that is connectable to an external terminal, and the pedestal portion 40 includes the terminal holding portion 56 that holds the terminal portion 36A.

With this configuration, the inductor 30 can reduce the influence of the magnetic field generated by flow of electricity in the terminal portion 36A on the electronic components 25 mounted on the circuit board 21, while having the function of a terminal block.

Also, the inductor 20 with circuit board includes: the inductor 30; the circuit board 21 on which the pedestal portion 40 is placed and that has a ground pattern 23A connected to a ground potential; and the electronic components 25 that are mounted on the circuit board 21, and that each have the lead terminal connected to the ground pattern 23A.

The influence of the magnetic field from the inductor 30 may affect the electronic components 25 connected to the ground pattern 23A. However, according to the present embodiment, it is possible to reduce the influence on the electronic components 25 in the configuration in which the influence of the magnetic field is likely to occur due to the connection to the ground pattern 23A.

Second Embodiment

Figure 12:
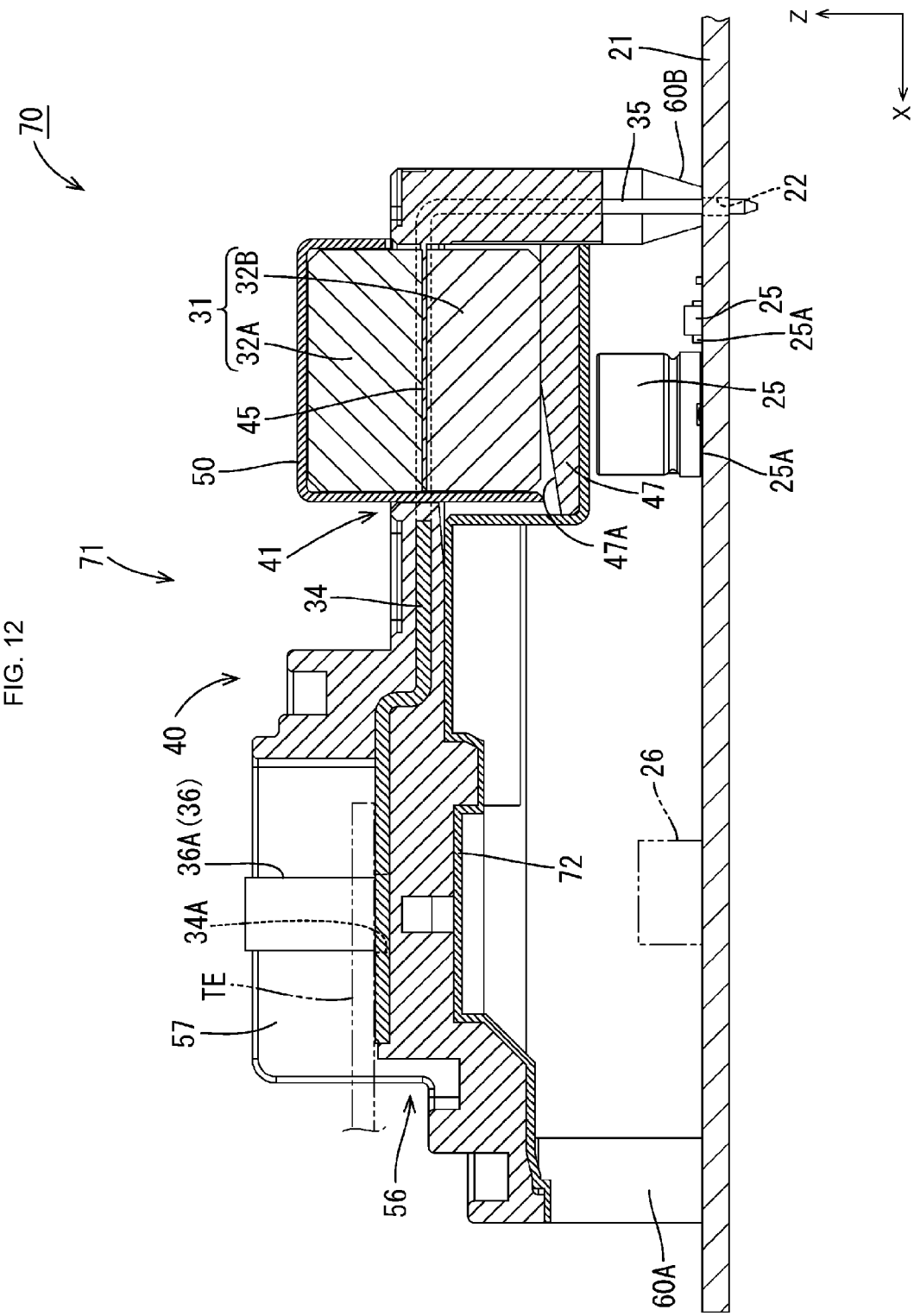
FIG. 12 is a cross-sectional view showing an inductor with circuit board according to a second embodiment.

A second embodiment will be described with reference to FIG. 12. An inductor 70 with circuit board according to the second embodiment has a shield portion 72 provided on the bottom surface of the terminal holding portion 56, in addition to the bottom surface of the core holding portion 41. In the following, the same components as those in the first embodiment will be denoted by the same reference numerals, and description thereof will be omitted.

The shield portion 72 is provided over the entire bottom surface (lower surface) of the pedestal portion 40 of an inductor 71. The shield portion is not limited to this, and may also be provided on the outer surface or the upper surface of the pedestal portion 40. The shield portion may also be provided, for example, over the entire outer surface (other than the terminal portion 36A) of the pedestal portion 40. Further, an electronic component 26 such as a capacitor, a FET, a resistor, and a coil may also be mounted on the circuit board 21 below the terminal holding portion 56 on the circuit board 21.

According to the second embodiment, because the shield portion 72 is provided over the entire surface of the pedestal portion 40 on the circuit board 21 side, it is possible to reduce the influence of the entire conduction path 34 in the inductor 71 on the electronic components 25 and 26 mounted on the circuit board 21.

Other Embodiments

The technique described in this specification is not limited to the embodiments described in the above description and the drawings, and the following embodiments are also included in the technical scope of the technique described in this specification.

The shape of the shield portion 63 is not limited to the above-mentioned box shape, but can be any of various shapes. The shape of the shield portion 63 may also be, for example, a flat shape that covers only the bottom surface of the core holding portion 41. Also, the shield portion 63 is not limited to a metal plate material, and may also be a metal foil such as aluminum or copper, or a mesh-shaped braided wire. Further, conductive resin may be used as the shield portion 63.

The pedestal portion 40 is made of synthetic resin, but is not limited to this. The pedestal portion may also be made of metal, for example, and the conduction path 34 and the inductor 30 may also be insulated from each other by an insulating layer made of an insulating adhesive or the like.

The direction of the plate surface of the conduction path 34 extending into the pedestal portion 40 may also be different from that of the above embodiment. A conduction path having a plate surface in a direction orthogonal to the plate surface of the conduction path 34 may also be inserted into the magnetic core, for example. In this case, the pair of divided members 32A and 32B may also be fitted in the left-right direction according to the direction of the plate surface of the conduction path.

The inductor 30 is formed by insert molding in which the conduction path 34 is disposed in the mold and resin is injected into the mold, but the present disclosure is not limited to this configuration. The conduction path may also be assembled, for, example, after the pedestal portion is formed, to the pedestal portion to form the inductor.

The invention claimed is:
1. An inductor, comprising:
   a magnetic core;
   a conduction path penetrating the magnetic core;
   a pedestal portion including a core holding portion that holds the magnetic core, and a support portion that supports, when placed on a circuit board, an electronic component at a height at which the electronic component can be accommodated on the circuit board and disposed between the circuit board and the core holding portion;
   a shield portion having a bottom wall and a side wall orthogonal to the bottom wall so as to define a seat, the bottom wall spaced apart from the circuit board and disposed between the circuit board and the magnetic core, and that shields a magnetic field generated by flow of electricity in the conduction path, wherein the core holding portion is disposed within the seat of the shield portion; and a conductive cover portion having a top wall and a side wall that covers a top and a side of the magnetic core, the side wall of the conductive cover portion is spaced apart from the side wall of the shield portion.

2. The inductor according to claim 1, wherein the shield portion is provided over the entire surface of the pedestal portion directly opposing the circuit board.

3. The inductor according to claim 1, further comprising:
a terminal portion that is connected to the conduction path, and that is connectable to an external terminal,
wherein the pedestal portion includes a terminal holding portion that holds the terminal portion.

4. An inductor with circuit board, comprising:
the inductor according to claim 1;
a circuit board on which the pedestal portion is placed, and that has a ground pattern connected to a ground potential; and
the electronic component that is mounted on the circuit board, and that has a terminal connected to the ground pattern.

5. An electrical junction box, comprising:
the inductor according to claim 1; and
a case that accommodates the inductor, the circuit board, and the electronic component.

6. The inductor according to claim 2, further comprising:
a terminal portion that is connected to the conduction path, and that is connectable to an external terminal,
wherein the pedestal portion includes a terminal holding portion that holds the terminal portion.

7. The inductor with circuit board as set forth in claim 4, further comprising:
a conductive cover portion that covers the side of the magnetic core opposite to the circuit board side.

8. The inductor with circuit board as set forth in claim 4, wherein the shield portion is provided over the entire surface of the pedestal portion on the circuit board side.

9. The inductor with circuit board as set forth in claim 4, further comprising:
a terminal portion that is connected to the conduction path, and that is connectable to an external terminal,
wherein the pedestal portion includes a terminal holding portion that holds the terminal portion.

10. The electrical junction box as set forth in claim 5, further comprising:
a conductive cover portion that covers the side of the magnetic core opposite to the circuit board side.

11. The electrical junction box as set forth in claim 5, wherein the shield portion is provided over the entire surface of the pedestal portion on the circuit board side.

12. The electrical junction box as set forth in claim 5, further comprising:
a terminal portion that is connected to the conduction path, and that is connectable to an external terminal,
wherein the pedestal portion includes a terminal holding portion that holds the terminal portion.

\* \* \* \* \*